US012480203B2

(12) United States Patent
Yu et al.

(10) Patent No.: US 12,480,203 B2
(45) Date of Patent: Nov. 25, 2025

(54) COATING MEMBER AND PREPARATION METHOD THEREOF, HOUSING, AND ELECTRONIC PRODUCT

(71) Applicant: BYD COMPANY LIMITED, Guangdong (CN)

(72) Inventors: Yuebin Yu, Shenzhen (CN); Jinbao Xu, Shenzhen (CN); Xiangwei Wang, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 0 days.

(21) Appl. No.: 18/373,842

(22) Filed: Sep. 27, 2023

(65) Prior Publication Data

US 2024/0018644 A1 Jan. 18, 2024

Related U.S. Application Data

(63) Continuation of application No. PCT/CN2022/087627, filed on Apr. 19, 2022.

(30) Foreign Application Priority Data

Apr. 30, 2021 (CN) ........................ 202110484484.1

(51) Int. Cl.
*C23C 14/34* (2006.01)
*C23C 14/00* (2006.01)
(Continued)

(52) U.S. Cl.
CPC .......... *C23C 14/34* (2013.01); *C23C 14/0015* (2013.01); *C23C 14/04* (2013.01); *C23C 14/16* (2013.01); *C23C 14/5833* (2013.01)

(58) Field of Classification Search
None
See application file for complete search history.

(56) References Cited

U.S. PATENT DOCUMENTS 5,523,259 A * 6/1996 Merchant ............ H01L 23/5226 438/643

FOREIGN PATENT DOCUMENTS

CN 102676988 A 9/2012
CN 103009705 A 4/2013
(Continued)

OTHER PUBLICATIONS

Gray et al., "Protective coatings on magnesium and its alloys—a critical review", Journal of Alloys and Compounds, Apr. 2002, vol. 336, No. 1-2, XP004343802, pp. 88-113.
(Continued)

*Primary Examiner* — Jason Berman
(74) *Attorney, Agent, or Firm* — Sheppard Mullin Richter & Hampton LLP

(57) ABSTRACT

An apparatus includes a substrate, an anodic oxidation layer, and a base layer. The anodic oxidation layer is disposed on a surface of the substrate, and the base layer is disposed on a surface of the anodic oxidation layer. The base layer includes a first base layer and a second base layer stacked on the anodic oxidation layer, and each of the first base layer and the second base layer includes a deposition layer of a first metal. An average grain size of the first base layer is less than an average grain size of the second base layer. The anodic oxidation layer includes a nanopore structure, and grains of the first base layer is at least partially embedded in the nanopore structure of the anodic oxidation layer.

19 Claims, 1 Drawing Sheet

(51) Int. Cl.

| | |
|---|---|
| ***C23C 14/04*** | (2006.01) |
| ***C23C 14/16*** | (2006.01) |
| ***C23C 14/58*** | (2006.01) |

(56) References Cited

FOREIGN PATENT DOCUMENTS

| | | | | |
|---|---|---|---|---|
| CN | 103866322 | A | | 6/2014 |
| CN | 104195569 | A | | 12/2014 |
| CN | 108677141 | A | | 10/2018 |
| CN | 110359045 | A | | 10/2019 |
| JP | 2006247795 | A | | 9/2006 |
| KR | 101723931 | B1 | * | 4/2017 |
| KR | 20210004249 | A | | 1/2021 |

OTHER PUBLICATIONS

International Search Report and Written Opinion for Application No. PCT/CN2022/087627, mailed on Jul. 8, 2022, 12 pages.

Norek et al., "H2 Absorption at Ambient Conditions by Anodized Aluminum Oxide (AAO) Pattern-Tansferred Pd Nanotubes Occluded by Mg Nanoparticles", Materials Chemistry and Physics, Mar. 2012, vol. 133, No. 1, pp. 376-382.

Norek et al., "A Comparative Study on the Hydrogen Absorption of Thin Films at Room Temperature Deposited on Non-Porous Glass Substrate and Nano-Porous Anodic Aluminum Oxide (AAO) Template", International Journal of Hydrogen Energy, Jul. 2011, vol. 36, No. 18, pp. 11777-11784.

* cited by examiner

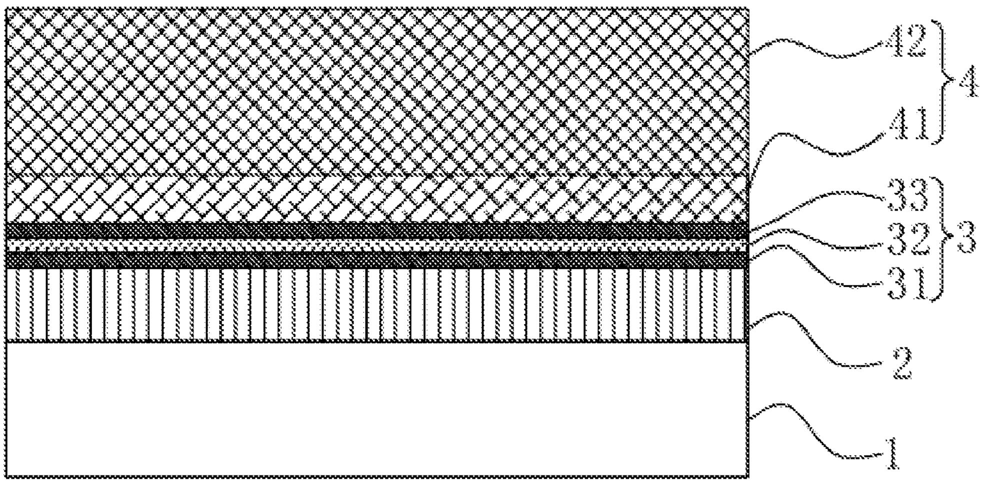
42
4
41
33
32
3
31
2
1

COATING MEMBER AND PREPARATION METHOD THEREOF, HOUSING, AND ELECTRONIC PRODUCT

CROSS-REFERENCE TO RELATED APPLICATIONS

This application is a Continuation Application of International Patent Application No. PCT/CN2022/087627, filed on Apr. 19, 2022, which is based on and claims priority to and benefits of Chinese Patent Application No. 202110484484.1, filed on Apr. 30, 2021. The entire content of all of the applications is incorporated herein by reference.

FIELD

The present disclosure relates to the field of metal surface processing technologies, and particularly, to a coating member and a preparation method thereof, a housing, and an electronic product.

BACKGROUND

Due to a lightweight requirement of electronic products, mainstream models mostly use aluminum alloy as a middle frame material. At present, a surface of the aluminum alloy is usually processed by using an anodic oxidation technology to improve corrosion resistance and abrasion resistance performance of the surface. A physical vapor deposition (physical vapor deposition, PVD) technology can not only improve abrasion resistance, corrosion resistance, and hardness of a surface of a substrate, but also obtain an appearance surface whose color and glossiness are better than those of the anodic oxidation technology. This technology has been widely applied to a stainless steel material. However, a PVD coating is seldom used for surface protection on an aluminum alloy substrate for the following reasons.

The aluminum alloy does not have a good bonding strength with the PVD coating, and a layer of aluminum oxide formed through natural oxidation is generated on a surface of the aluminum alloy, which affects bonding of the aluminum alloy and the PVD coating. For existing aluminum alloy, a porous cellular structure is presented on a surface of an aluminum material after anodic oxidation, a conventional PVD coating can be hardly bonded to an anodic oxidation layer, resulting in poor abrasion resistance performance and poor corrosion resistance performance of the surface. As a result, an appearance surface of the aluminum material does not include apparent metal texture and loses a contention advantage over a mature process solution of anodic dyeing and hole-sealing.

SUMMARY

To solve the existing problems of poor abrasion resistance and poor corrosion resistance of performing PVD coating on aluminum alloy after anodic oxidation, the present disclosure provides an apparatus and a preparation method thereof, a housing, and an electronic product.

According to a first aspect, the present disclosure provides an apparatus, including a substrate, an anodic oxidation layer, and a base layer. The anodic oxidation layer is disposed on a surface of the substrate, and the base layer is disposed on a surface of the anodic oxidation layer. The base layer includes a first base layer and a second base layer stacked on the anodic oxidation layer, and each of the first base layer and the second base layer includes a deposition layer of a first metal. An average grain size of the first base layer is less than an average grain size of the second base layer. The anodic oxidation layer includes a nanopore structure, and grains of the first base layer is at least partially embedded in the nanopore structure of the anodic oxidation layer.

According to an embodiment of the present disclosure, the substrate includes aluminum or aluminum alloy.

According to an embodiment of the present disclosure, the first metal includes Cr and/or Ti.

According to an embodiment of the present disclosure, a thickness of the first base layer is from 30 nm to 100 nm, and a thickness of the second base layer is from 50 nm to 120 nm.

According to an embodiment of the present disclosure, an average grain size in the first base layer is from 3 nm to 30 nm, and a nanohardness of the first base layer is from 10 GPa to 16 GPa.

According to an embodiment of the present disclosure, an average grain size in the second base layer is from 50 nm to 100 nm, and a nanohardness of the second base layer is from 6 GPa to 9 GPa.

According to an embodiment of the present disclosure, the base layer further includes a third base layer, the first base layer, the second base layer, and the third base layer are stacked on the anodic oxidation layer, the third base layer comprises a deposition layer of the first metal, and an average grain size of the third base layer is less than the average grain size of the second base layer.

According to an embodiment of the present disclosure, the average grain size in the third base layer is from 30 nm to 60 nm, and a nanohardness of the third base layer is from 8 GPa to 10 GPa.

According to an embodiment of the present disclosure, a thickness of the third base layer is from 30 nm to 100 nm.

According to an embodiment of the present disclosure, a thickness of the anodic oxidation layer is from 4 μm to 16 μm.

According to an embodiment of the present disclosure, a pore size of pores of the nanopore structure of the anodic oxidation layer ranges from 10 nm to 100 nm, and a density of pores in the nanopore structure of the anodic oxidation layer is from 100 per $\mu m^2$ to 3000 per $\mu m^2$.

According to an embodiment of the present disclosure, further comprising a function layer, wherein the function layer is disposed on a surface of the base layer away from the anodic oxidation layer, the function layer comprises a color layer, the color layer comprises one or more of an oxide of a second metal, a nitride of the second metal, and a carbide of the second metal, and the second metal is selected from one or more of Cr, Ti, and W.

According to an embodiment of the present disclosure, a thickness of the color layer is from 0.3 μm to 3 μm.

According to an embodiment of the present disclosure, the function layer further includes a transition layer, the transition layer is located between the color layer and the base layer, and the transition layer includes the first metal and the second metal.

According to an embodiment of the present disclosure, a thickness of the transition layer is from 0.3 μm to 1 μm.

According to a second aspect, the present disclosure provides a method for preparing the apparatus described above, and the method includes the following operations:

- providing a substrate and performing anodic oxidation processing on a surface of the substrate, to form an anodic oxidation layer;

- using the first metal as a first target, applying a first negative bias voltage to the substrate, and forming the first base layer on the surface of the anodic oxidation layer through sputtering in a first vacuum coating; and
- using the first metal as a second target, forming the second base layer on a surface of the first base layer through sputtering in a second vacuum coating without applying a bias voltage to the substrate.

According to an embodiment of the present disclosure, before performing the anodic oxidation processing, the method further includes: dispensing glue on an electrical contact site on the surface of the substrate; and after performing the anodic oxidation processing, removing the glue on the electrical contact site on the surface of the substrate, to expose the electrical contact site.

According to an embodiment of the present disclosure, the method further includes: providing a tank solution of an anodic oxidation tank for the anodic oxidation processing, where the tank solution is selected from at least one of a sulfuric acid solution, a phosphoric acid solution, and an oxalic acid solution, a molar concentration of acid in the tank solution is from 0.3 mol/L to 0.8 mol/L, and a temperature of the tank solution is from 15° C. to 25° C.

According to an embodiment of the present disclosure, the first vacuum coating includes: applying the first negative bias voltage to the substrate, where the first negative bias voltage is from 200 V to 400 V, and applying a first target current of from 20 A to 30 A to the first target.

According to an embodiment of the present disclosure, after the forming the first base layer and before forming the second base layer, the method further includes: performing ion bombardment on the first base layer for 5 min to 10 min.

According to an embodiment of the present disclosure, the second vacuum coating includes: applying a second target current of from 5 A to 10 A to the second target without applying the bias voltage to the substrate.

According to an embodiment of the present disclosure, the method further includes the following operations:

- using the first metal as a third target, applying a third negative bias voltage to the substrate, and forming a third base layer on a surface of the second base layer through sputtering in a third vacuum coating.

According to an embodiment of the present disclosure, the third vacuum coating includes: applying the third negative bias voltage to the substrate, the third negative bias voltage being from 30 V to 120 V, and applying a third target current of from 15 A to 25 A to the third target.

According to an embodiment of the present disclosure, the method further includes the following operations:

- using the first metal and a second metal as a fourth target, forming a transition layer on a surface of the third base layer through sputtering in a fourth vacuum coating, the first metal including one or more of Cr and Ti, and the second metal including one or more of Cr, Ti, and W.

According to an embodiment of the present disclosure, the method further includes the following operations:

- using the second metal as a fifth target, introducing reactive gas comprising one or more of an oxygen source, a nitrogen source, or a carbon source, and forming a color layer on a surface of the transition layer through sputtering in a fifth vacuum coating.

According to a third aspect, the present disclosure provides a housing, including the apparatus described above.

According to a fourth aspect, the present disclosure provides an electronic product, including the housing described above.

According to the apparatus provided in the present disclosure, the anodic oxidation layer is disposed on the surface of the substrate, the base layer is disposed outside the anodic oxidation layer, and the base layer includes the first base layer with a smaller average grain size and the second base layer with a greater average grain size.

Other aspects and advantages of the present disclosure will be given in the following description, some of which will become apparent from the following description or may be learned from practices of the present disclosure.

BRIEF DESCRIPTION OF THE DRAWINGS

FIG. 1 is a schematic structural diagram of a coating member according to the present disclosure.

The reference numerals in the accompanying drawings of this specification are as follow.

1: Substrate; 2; Anodic oxidation layer; 3; Base layer; 31; First base layer; 32; Second base layer; 33; Third base layer; 4; Function layer; 41; Transition layer; and 42; and Color layer.

DETAILED DESCRIPTION

To make the technical problems to be resolved by the present disclosure, technical solutions, and beneficial effects clearer and more comprehensible, the following further describes the present disclosure in detail with reference to the accompanying drawings and embodiments. It should be understood that the embodiments described herein are only used to explain the present disclosure and are not to limit the present disclosure.

As shown in FIG. 1, an embodiment of the present disclosure provides coating member, including a substrate 1, an anodic oxidation layer 2, and a base layer 3. The anodic oxidation layer 2 is formed on a surface of the substrate 1, and the base layer 3 is located on a surface of the anodic oxidation layer 2. The base layer 3 includes a first base layer 31 and a second base layer 32 that are sequentially stacked in a direction away from the anodic oxidation layer 2 (e.g., the first base layer 31 is on the anodic oxidation layer 2, and the second base layer 32 is on the first base layer 31), the first base layer 31 and the second base layer 32 are selected from a deposition layer of a metal A, an average grain size of the first base layer 31 is less than an average grain size of the second base layer 32, the anodic oxidation layer 2 includes a nanopore structure, and grains of the first base layer 31 are partially embedded in nanopores of the anodic oxidation layer 2.

Because the average grain size of the first base layer 31 is small, the first base layer can be better embedded in the nanopores of the anodic oxidation layer 2, so that a contact area is increased, and a bonding force between the base layer 3 and the anodic oxidation layer 2 is further improved. Meanwhile, the average grain size of the second base layer 32 is greater than that of the first base layer 31, so that an internal stress of the base layer 3 can be reduced to some extent, thereby avoiding a problem that a film layer falls off due to an excessively great stress of the base layer 3. On one hand, the base layer 3 formed by the first base layer 31 and the second base layer 32 through bonding can seal the nanopores of the anodic oxidation layer 2, to prevent dust from entering the anodic oxidation layer 2 subsequently. On the other hand, the base layer can be used as a basis for subsequent vacuum coating, so that a bonding strength between the substrate 1 and the subsequent vacuum coating can be effectively improved, thereby achieving abrasion resistance and corrosion resistance effects.

In some embodiments, the substrate 1 includes aluminum or aluminum alloy.

In different embodiments, the substrate 1 may be an integral piece of aluminum or aluminum alloy, or a part of the substrate is a stacked structure or an inlaid structure of aluminum or aluminum alloy.

In some embodiments, the metal A includes Cr and/or Ti.

In some embodiments, a thickness of the first base layer 31 ranges from 30 nm to 100 nm, and a thickness of the second base layer 32 ranges from 50 nm to 120 nm.

When the thickness of the first base layer 31 falls within the foregoing range, the first base layer 31 has a strong bonding force with the anodic oxidation layer 2. Meanwhile, when the thickness of the second base layer 32 falls within the foregoing range, an internal stress of the first base layer 31 can be well weakened by the second base layer 32, to form a transition and buffer effect.

In some embodiments, an average grain size of the crystal grains in the first base layer 31 ranges from 3 nm to 30 nm, and a nanohardness of the first base layer 31 ranges from 10 GPa to 16 GPa.

In some embodiments, an average grain size of crystal grains in the second base layer 32 ranges from 50 nm to 100 nm, and a nanohardness of the second base layer 32 ranges from 6 GPa to 9 GPa.

The first base layer 31 is a fine-crystal structure, which has a stable and dense structure, good adhesion performance, but has a high hardness and a high internal stress after shaping, and therefore has some defects (vacancies, point defects, and line defects). The second base layer 32 is a coarse columnar-crystal structure, which has a relatively low hardness. Therefore, it is conducive to reducing the internal stress and reducing a quantity of defects by bonding the second base layer 32 to the first base layer 31.

In some embodiments, the base layer 3 further includes a third base layer 33, the first base layer 31, the second base layer 32, and the third base layer 33 are sequentially stacked in the direction away from the anodic oxidation layer 2, the third base layer 33 is selected from the deposition layer of the metal A, and an average grain size of the third base layer 33 is less than the average grain size of the second base layer 32.

Because the second base layer 32 is a coarse columnar-crystal structure, a property thereof is not dense enough, when another material is directly coated on the second base layer 32, a problem of an insufficient bonding force occurs. By arranging the third base layer 33 outside the second base layer 32, the columnar-crystal structure can be converted into a fine-crystal structure, so that a dense surface is formed, which is conducive to improving abrasion resistance performance thereof and providing a good adhesion basis for a subsequent coating.

In some embodiments, an average size of grains in the third base layer 33 ranges from 30 nm to 60 nm, and a nanohardness of the third base layer 33 ranges from 8 GPa to 10 GPa.

The average grain size and nanohardness of the third base layer 33 are located between those of the first base layer 31 and those of the second base layer 32, so that an entire strength and abrasion resistance performance of the base layer 3 are further improved.

In some embodiments, a thickness of the third base layer 33 ranges from 30 nm to 100 nm.

When the thickness of the third base layer 33 falls within the foregoing range, good coverage is achieved, thereby preventing a problem of coverage not in place or an excessively great internal stress.

In some embodiments, a thickness of the anodic oxidation layer 2 ranges from 4 μm to 16 μm.

In some embodiments, a pore size of the nanopores of the anodic oxidation layer 2 ranges from 10 nm to 100 nm, and a density of the nanopores of the anodic oxidation layer is from 100 per $\mu m^2$ to 3000 per $\mu m^2$.

When the pore size and the quantity of the nanopores of the anodic oxidation layer 2 fall within the foregoing ranges, sufficient nanopores can be provided for bonding to the first base layer 31, and the pore size is also conducive to embedding the grains of the first base layer 31 into the nanopores of the anodic oxidation layer 2, to improve a bonding strength.

In some embodiments, the coating member further includes a function layer 4, and the function layer 4 is located on a side/surface of the base layer 3 facing away from the anodic oxidation layer 2.

In different embodiments, the function layer 4 may be coating layers implementing different functions, for example, an anti-fingerprint layer or a high hardness layer, or may be a decorative layer such as a color layer or a glare layer.

In some embodiments, the function layer 4 includes a color layer 42, the color layer 42 includes an oxide of a metal M, a nitride of a metal M, a carbide of a metal M, or a combination thereof, and the metal M is selected from one or more of Cr, Ti, and W.

The color layer 42 may include a single layer or multiple layers, and when the color layer 42 includes multiple layers, different oxides of the metal M, nitrides of the metal M, or carbides of the metal M may be arranged in different layers, to achieve an objective of adjusting a color.

In some embodiments, a thickness of the function layer 4 ranges from 0.3 μm to 3.7 μm.

In some embodiments, a thickness of the color layer 42 ranges from 0.3 μm to 3 μm.

In some embodiments, the color layer 42 is directly arranged on a surface of the base layer 3.

In another embodiment, the function layer 4 further includes a transition layer 41, the transition layer 41 is located between the color layer 42 and the base layer 3, and the transition layer 41 includes the metal A and the metal M.

The transition layer 41 is used as a transition between the base layer 3 and the color layer 42. The base layer 3 includes the metal A, the color layer 42 is formed by the oxide of the metal M, the nitride of the metal M, or the carbide of the metal M, the transition layer 41 includes both the metal A and the metal M, so that affinities of the transition layer 41 with the base layer 3 and the color layer 42 are both high, thereby ensuring good bonding strengths between the transition layer with the base layer 3 and the color layer 42, and avoiding a stratification phenomenon caused by an excessively great material difference.

In some embodiments, a thickness of the transition layer 41 ranges from 0.3 μm to 1 μm.

Another embodiment of the present disclosure provides a method for preparing the coating member described above, and the method includes the following operation steps:

- providing a substrate 1 and performing anodic oxidation processing on a surface of the substrate 1, to form an anodic oxidation layer 2;
- using a metal A as a target, applying a negative bias voltage to the substrate 1, and forming a first base layer 31 on a surface of the anodic oxidation layer 2 through sputtering in a vacuum coating process; and using the metal A as a target, without applying a bias voltage to the substrate 1, and forming a second base layer 32 on a surface of the first base layer 31 through sputtering in a vacuum coating process.

In the preparation method provided above, in a vacuum coating process of the first base layer 31, high-energy particles impact the target of the metal A to ionize metal A ions, by applying the negative bias voltage to the substrate 1, attraction of the substrate 1 for the metal A ions can be improved and the metal A ions are accelerated, so that the metal A ions also have energy to bombard the substrate 1 while the metal A ions are deposited. In addition, by providing the negative bias voltage, the shaped first base layer 31 is converted from a coarse columnar-crystal structure into a fine-crystal structure. The fine-crystal structure is stable and dense, is an ideal film layer structure, and has good adhesion performance. In a vacuum coating process of the second base layer 32, no bias voltage is used, the formed metal A ions tend to be deposited on the first base layer 31 to form a coarse columnar-crystal structure, which has a low hardness and is conducive to reducing an internal stress of the first base layer 31.

In some embodiments, before the anodic oxidation processing, the method further includes: performing glue dispensing processing on an electrical contact site on the surface of the substrate 1; and performing glue removing on the surface of the substrate 1 (e.g., on the electrical contact site) after anodic oxidation processing, to expose the electrical contact site, so as to apply a negative bias voltage to the substrate 1 through the electrical contact site in a subsequent operation.

In this preparation method, a negative bias voltage needs to be applied to the substrate 1, but the anodic oxidation layer 2 generated through anodic oxidation is a non-conductive structure and is not conducive to electrical contact between the substrate 1 and a power supply applying the negative bias voltage. To ensure the negative bias voltage applied to the substrate 1, the inventor performs glue dispensing processing on the electrical contact site of the substrate 1 before the anodic oxidation processing, to protect the substrate 1, and perform glue removing after the anodic oxidation, so that subsequent applying of the negative bias voltage to the substrate 1 can be effectively protected, thereby improving film formation quality.

A material used for the glue dispensing processing is not limited, and may be an existing plastic material.

In some embodiments, before the glue dispensing processing, polishing processing is performed on the substrate 1, where the polishing processing is chemical polishing, mechanical polishing, or a combination thereof. A natural oxidation layer and surface defects (for example, scratches) on the surface of the substrate 1 are removed through the polishing processing, so that smoothness of the surface of the substrate 1 can be improved, which is conducive to direct contact between plastics and the surface of the substrate 1 during glue dispensing processing, and is also conducive to formation of a denser anodic oxidation layer 2 during the anodic oxidation processing.

In some embodiments, after the glue dispensing processing is performed, one or more of degreasing, hot water washing, alkaline water washing, cold water washing, acid washing, and other operations are performed on the surface of the substrate 1, so that the substrate 1 forms a smooth surface, and greasy dirt and defects on the surface are removed, thereby improving film formation consistency.

In some embodiments, conditions of the anodic oxidation processing are: a tank solution of an anodic oxidation tank is provided for the anodic oxidation processing, the tank solution is selected from at least one of a sulfuric acid solution, a phosphoric acid solution, and an oxalic acid solution, a molar concentration of acid in the tank solution ranges from 0.3 mol/L to 0.8 mol/L, and a temperature of the tank solution ranges from 15° C. to 25° C.

Through the foregoing anodic oxidation processing, an anodic oxidation layer 2 whose porosity is uniform and a pore size ranges from 10 nm to 100 nm is formed on the surface of the substrate 1, which is conducive to embedding of grains of the first base layer 31.

In some embodiments, before the first base layer 31 is prepared, a pre-vacuumizing operation is performed on the substrate 1 on which the anodic oxidation layer 2 is formed.

A large quantity of nanopores exist on the anodic oxidation layer 2 on the substrate 1, dust in the air may be easily absorbed by the nanopores, and scraps remaining in a processing process are also left in the nanopores. The dust and scraps remaining in the nanopores may become surface impurities in subsequent vacuum coating, further affecting film layer performance. To resolve the problem, a pre-vacuumizing manner is used in this preparation method, to removing the dust and scraps in the nanopores of the anodic oxidation layer 2 through barometric pressure changes, thereby ensuring subsequent coating quality.

In some embodiments, before the first base layer 31 is prepared, ion bombardment is performed on the anodic oxidation layer 2, to improve cleanness of the anodic oxidation layer 2 and improve surface energy of the anodic oxidation layer 2.

In some embodiments, when the first base layer 31 is prepared, conditions for controlling vacuum coating are: a negative bias voltage is applied to the substrate, a voltage value of the negative bias voltage ranges from 200 V to 400 V, and a target current ranges from 20 A to 30 A is applied to the target.

It should be noted that, the bias voltage used for preparing the first base layer 31 is a further improvement in this preparation method. To further increase a bonding force between the first base layer 31 and the anodic oxidation layer 2, the inventor uses a high bias voltage process parameter that exceeds a normal range, and the bias voltage range may push the metal A ions to enter the nanopore structure of the anodic oxidation layer 2, thereby increasing a contact area and improving adhesion. However, an excessively high negative bias voltage may cause an increase in reverse sputtering and a decrease in a deposition rate, cause a large quantity of defects (vacancies, point defects, and line defects), and damage film layer integrity. As a result, film layer quality is reduced and surface performance is affected.

In some embodiments, after the first base layer 31 is prepared and before the second base layer 32 is prepared, the method further includes: performing ion bombardment on the first base layer 31 for 5 min to 10 min, to improve surface energy of the first base layer 31.

In some embodiments, when the second base layer 32 is prepared, conditions for controlling vacuum coating are: a direct current mode, without the bias voltage, a target current ranges from 5 A to 10 A is applied to the target.

To restore the damaged first base layer 31 to some extent, a softer second base layer 32 needs to be deposited on the basis to form a transition, to reduce the internal stress of the first base layer 31 and reduce a quantity of defects.

In some embodiments, the preparation method further includes the following operations:

using the metal A as a target, applying a negative bias voltage to the substrate 1, and forming a third base layer 33 on a surface of the second base layer 32 through sputtering in a vacuum coating process.

The second base layer 32 prepared without a bias voltage is a coarse columnar-crystal structure, so that after the second base layer 32 is deposited by a thickness, the third base layer 33 is added to convert the film layer from a columnar structure into a fine-crystal structure, to finally complete coating of the base layer 3.

In some embodiments, when the third base layer 33 is prepared, conditions for controlling vacuum coating are: a negative bias voltage is applied to the substrate, a voltage value of the negative bias voltage ranges from 30 V to 120 V, and a target current ranges from 15 A to 25 A is applied to the target.

In some embodiments, the preparation method further includes the following operations:

using the metal A and a metal M as a target, forming a transition layer 41 on a surface of the base layer 3 (e.g., the third base layer 33) through sputtering in a vacuum coating process, the metal A including Cr and/or Ti, and the metal M including one or more of Cr, Ti, and W.

In some embodiments, the preparation method further includes the following operations:

using the metal M as a target, introducing one or more of an oxygen source, a nitrogen source, or a carbon source as reactive gas, and forming a color layer 42 on a surface of the transition layer 41 through sputtering in a vacuum coating process.

The oxygen source may be selected from $O_2$, the nitrogen source may be selected from $N_2$, and the carbon source may be selected from $C_2H_2$.

It should be noted that, when two or more of the oxygen source, the nitrogen source, or the carbon source are used as reactive gas, to avoid mutual reaction between the reactive gas, the oxygen source, the nitrogen source, or the carbon source is respectively introduced to react with metal M ions formed through sputtering from the target, to form a mixed layer of an oxide of the metal M, a nitride of the metal M, or a carbide of the metal M.

In some embodiments, when the color layer 42 is prepared, the reactive gas may not be introduced, to obtain a coating of the metal M, where the coating is metallic.

An embodiment of the present disclosure provides an electronic product housing, including the coating member described above.

Because the coating member described above is used, the electronic product housing has good surface abrasion resistance performance and also achieves an optimal appearance effect.

The present disclosure is further described below through embodiments.

Embodiment 1

This embodiment is used to describe a coating member and a preparation method thereof disclosed in the present disclosure. The method includes the following operation steps:

(1) Anodic oxidation preprocessing: processing of mechanical polishing, glue dispensing, degreasing, hot water washing, alkali washing, cold water washing, acid washing, and cold water washing is sequentially performed on an aluminum alloy substrate.

(2) Anodic oxidation processing: The preprocessed aluminum alloy substrate is placed in an anodic oxidation tank for anodic oxidation, where a solution used for the anodic oxidation is a sulfuric acid solution whose concentration is 0.5 mol/L, and a temperature of the tank solution is 18° C., to form an anodic oxidation layer of which a film layer thickness is 8 nm, a pore size ranges from 20 nm to 40 nm, and a quantity of nanopores is 2000 per $\mu m^2$.

(3) PVD coating preprocessing: the PVD coating preprocessing includes glue removing, cleaning, drying, and pre-vacuumizing. The glue removing is to remove plastics in step (1).

(4) PVD coating: the aluminum substrate through the foregoing processing is placed in a vacuum coating machine, and coating processing is performed on the aluminum substrate after vacuumizing, heating, and ion cleaning. Details of the coating processing are as follows:

Preparation of a first base layer: a Cr target is used, a bias voltage is set to −300 V, a Cr target current is 25 A, and a coating film layer thickness is 50 nm, where an average grain size of the first base layer is 8 nm, and a nanohardness of the first base layer is 14 GPa; ion bombardment is performed for 10 min after coating;

preparation of a second base layer: a Cr target is used, a direct current mode (no bias voltage) is set, a Cr target current is 8 A, and a coating film layer thickness is 80 nm, where an average grain size of the second base layer is 60 nm, and a nanohardness of the first base layer is 8 GPa; and preparation of a third base layer: a Cr target is used, a bias voltage is set to −80 V, a Cr target current is 20 A, and a coating film layer thickness is 60 nm, where an average grain size of the third base layer is 40 nm, and a nanohardness of the third base layer is 9 GPa. That is, coating of a base layer is completed.

Preparation of a transition layer: a Ti target and a Cr target are used together for coating, a direct current mode (no bias voltage) is set, a target current is 20 A, and a coating film layer thickness is 500 nm.

Preparation of a color layer: a Ti target is used, reactive gas is introduced during magnetron sputtering, where the reactive gas is nitrogen, a direct current mode (no bias voltage) is set, a target current is 20 A, and a coating film layer thickness is 800 nm.

Embodiment 2

This embodiment is used to describe a coating member and a preparation method thereof disclosed in the present disclosure. Most operations in Embodiment 1 are included, and the difference includes the following.

In the preparation of the first base layer: a Cr target is used, a bias voltage is set to −200 V, a Cr target current is 20 A, and a coating film layer thickness is 100 nm, where an average grain size of the first base layer is 25 nm, and a nanohardness of the first base layer is 11 GPa; and ion bombardment is performed for 10 min after coating.

In the preparation of the second base layer: a Cr target is used, a direct current mode (no bias voltage) is set, a Cr target current is 10 A, and a coating film layer thickness is 50 nm, where an average grain size of the second base layer is 50 nm, and a nanohardness of the first base layer is 9 GPa.

In the preparation of the third base layer: a Cr target is used, a bias voltage is set to −120 V, a Cr target current is 25 A, and a coating film layer thickness is 30 nm, where an average grain size of the third base layer is 30 nm, and a nanohardness of the third base layer is 10 GPa. That is, coating of a base layer is completed.

Embodiment 3

This embodiment is used to describe a coating member and a preparation method thereof disclosed in the present disclosure. Most operations in Embodiment 1 are included, and the difference includes the following.

In the preparation of the first base layer: a Cr target is used, a bias voltage is set to −400 V, a Cr target current is 30 A, and a coating film layer thickness is 30 nm, where an average grain size of the first base layer is 3 nm, and a nanohardness of the first base layer is 16 GPa; and ion bombardment is performed for 10 min after coating.

In the preparation of the second base layer: a Cr target is used, a direct current mode (no bias voltage) is set, a Cr target current is 5 A, and a coating film layer thickness is 120 nm, where an average grain size of the second base layer is 100 nm, and a nanohardness of the first base layer is 6 GPa.

In the preparation of the third base layer: a Cr target is used, a bias voltage is set to −30 V, a Cr target current is 15 A, and a coating film layer thickness is 100 nm, where an average grain size of the third base layer is 60 nm, and a nanohardness of the third base layer is 8 GPa. As such, coating of a base layer is completed.

Embodiment 4

This embodiment is used to describe a coating member and a preparation method thereof disclosed in the present disclosure. Most operations in Embodiment 1 are included, and the difference includes the following.

In the preparation of the first base layer, a coating film layer thickness is 20 nm.

Embodiment 5

This embodiment is used to describe a coating member and a preparation method thereof disclosed in the present disclosure. Most operations in Embodiment 1 are included, and the difference includes the following.

In the preparation of the first base layer, a coating film layer thickness is 150 nm.

Embodiment 6

This embodiment is used to describe a coating member and a preparation method thereof disclosed in the present disclosure. Most operations in Embodiment 1 are included, and the difference includes the following.

In the preparation of the second base layer, a coating film layer thickness is 40 nm.

Embodiment 7

This embodiment is used to describe a coating member and a preparation method thereof disclosed in the present disclosure. Most operations in Embodiment 1 are included, and the difference includes the following.

In the preparation of the second base layer, a coating film layer thickness is 150 nm.

Embodiment 8

This embodiment is used to describe a coating member and a preparation method thereof disclosed in the present disclosure. Most operations in Embodiment 1 are included, and the difference includes the following.

In the preparation of the first base layer, a bias voltage is set to −500 V.

Embodiment 9

This embodiment is used to describe a coating member and a preparation method thereof disclosed in the present disclosure. Most operations in Embodiment 1 are included, and the difference includes the following.

In step (4), after the second base layer is prepared, the preparation of the third base layer is not performed, and the transition layer is directly coated on the second base layer.

Embodiment 10

This embodiment is used to describe a coating member and a preparation method thereof disclosed in the present disclosure. Most operations in Embodiment 1 are included, and the difference includes the following.

In step (3), pre-vacuuming is not performed.

Comparative Embodiment 1

This comparative embodiment is used to describe a coating member and a preparation method thereof disclosed in the present disclosure. Most operations in Embodiment 1 are included, and the difference includes the following.

In step (4), when preparation of the base layer is performed, the preparation of the first base layer is not performed, and the preparation of the second base layer and the preparation of the third base layer are directly performed.

Comparative Embodiment 2

This comparative embodiment is used to describe a coating member and a preparation method thereof disclosed in the present disclosure. Most operations in Embodiment 1 are included, and the difference includes the following.

In step (4), when preparation of the base layer is performed, the preparation of the second base layer is not performed, and the preparation of the first base layer and the preparation of the third base layer are directly performed.

Performance Test

The following performance test is performed on coating members prepared in the foregoing Embodiments 1 to 10 and Comparative embodiments 1 and 2.

1. Cross-Cut Adhesion Test:

(1) Before the test, whether there is an appearance abnormality, discoloration, a bubble, a gap, or peel-off is inspected, and wipe and clean a surface of a substrate using a dust-free cloth.

(2) Cross cutting the tested surface by a knife, and a knife surface is perpendicular to the tested surface during the cross cutting to prevent a knife edge from wrapping a film layer, where an angle between a cross cutting direction and a sample is 45 degrees, and a force was applied to the cutting knife evenly, the force is applied to the knife such that the knife cut through the film layer exactly to reach the substrate to form a 10×10 grid of consecutive 1 mm×1 mm squares.

(3) Fragments in a tested area was cleaned up by using the dust-free cloth, a segment of NICHIBAN CT405AP-24 tape was pulled out evenly, the foremost section of the segment was removed, and a tape having a length of 55 mm was cut down, a central point of the tape was placed on the grid parallel to a group of cutting lines, and the part of the tape on the grids was flattened by fingernails, to ensure that the tape is in well contact the film layer (it should be noted that the tape and the film layer are not allowed to be scratched by the fingernails), where the length of the tape exceeds the grid by at least 20 mm.

(4) The tape was stuck and placed for 90 second, holding a suspended end of the tap and then quickly pulling down the tape within 0.5 s to 1.0 s at an angle close to 60 degrees.

(5) Inspecting the peel-off status of the film layer, where when the peel-off status reaches or exceeds 4B, the cross-cut adhesion is qualified, and evaluation standards are as follows.

5B: A cutting edge is completely smooth, and no coating peels off.

4B: A few coatings peel off at a cutting notch intersection, and an affected cross cutting area is not greater than 5%.

3B: A coating peels off at a cutting notch intersection and/or along an edge of a cutting notch, and an affected cross cutting area is greater than 5% but not greater than 15%.

2B: The film layer partially or totally peels off along a cutting edge in a form of a large fragment, and/or partially or totally peels off on different part of the grids, and an affected cross cutting area is greater than 15% but not greater than 35%.

1B: The coating peels off along a cutting edge in a form of a large fragment, and/or some square grids partially or totally peel off, and an affected cross cutting area is greater than 35% but not greater than 65%.

0B: A peel-off degree exceeds 1B.

2. Abrasion resistance performance:

(1) Three parts of RKF 10K (yellow cone) and one part of RKK15P (green pyramid) were prepared with a total volume is 15 L, and were added to a grinding tank of a vibration friction device (ROSLER, a model is R180/530 TE-30, a frequency is 50±0.5 Hz, and an amplitude is 1.65±0.1 mm).

(2) A pipette was used to extract 10 ml of FC120 into the grinding tank, and 0.5 L of water was added.

(3) 0.5 L of water was added to the grinding tank. In the test process, 0.5 L of water and 10 ml of FC120 are added every 30 min.

(4) A complete machine for testing or a complete machine for counterweight was prepared, the samples were mounted on the complete machine, and then the complete machine was placed into the vibration friction device for testing. Each sample was checked every hours, and the longest duration that meets a standard was recorded. The standard may include: consecutive sawtooth abrasion is not greater than 10 mm (definition of sawtooth: widths of two or more positions in a linear abrasion area range from 1 mm to 1.5 mm, and it is not accepted when a width is greater than 1.5 mm); and point abrasion is not greater than 1.5 mm×1.5 mm, where a quantity of point abrasion ranging from 1 mmxl mm to 1.5 mm×1.5 mm is not greater than two, and point abrasion less than 1 mm×1 mm is ignored.

3. Salt spray test:

In a sealed environment where a temperature is 35° C. and a humidity is 90%, a wt % NaCl solution with PH value of 6.8 was used to perform salt spray on a surface of a coating member continuously. An appearance of the sample was inspected each time after the test is performed for 12 hours. Then, the product was gently washed with 38° C. warm water and wiped with a dust-free cloth, and the sample was inspected after being placed at room temperature for 2 hours. The longest duration that the appearance of the film layer was not abnormal and the appearance had no significant change (such as rust, discoloration, and peel-off of a surface processing layer) was recorded.

Obtained test results are filled in Table 1.

TABLE 1

| | Test | | |
|---|---|---|---|
| Sample | Cross-cut adhesion | Abrasion resistance performance | Salt spray test |
| Embodiment 1 | 5B | 4 h | 48 h |
| Embodiment 2 | 5B | 4 h | 48 h |
| Embodiment 3 | 5B | 4 h | 48 h |
| Embodiment 4 | 5B | 3 h | 48 h |
| Embodiment 5 | 4B | 3 h | 48 h |
| Embodiment 6 | 4B | 3 h | 48 h |
| Embodiment 7 | 5B | 3 h | 48 h |
| Embodiment 8 | 4B | 4 h | 36 h |
| Embodiment 9 | 5B | 3 h | 48 h |
| Embodiment 10 | 4B | 3 h | 48 h |
| Comparative embodiment 1 | 3B | 0 h | 48 h |
| Comparative embodiment 2 | 3B | 0 h | 48 h |

It can be learned from the test results in Table 1 that, compared with the comparative embodiments, the coating member provided in the present disclosure has more excellent film layer adhesion, abrasion resistance performance, and corrosion resistance. This indicates that by controlling average grain sizes of different film layers in the base layer, bonding strengths between the base layer with the anodic oxidation layer and the external function layer can be effectively improved.

Although the embodiments of the present disclosure are described above with reference to the accompanying drawings, the present disclosure is not limited to the foregoing implementations, and the foregoing implementations are merely exemplary rather than limitative. A person of ordinary skill in the art may further make various forms under the inspiration of the present disclosure and without departing from the spirit of the present disclosure and the protection scope of the claims, and all the forms fall within the protection scope of the present disclosure.

What is claimed is:

1. An apparatus, comprising a substrate, an anodic oxidation layer, and a base layer, the anodic oxidation layer being disposed on a surface of the substrate, the base layer being disposed on a surface of the anodic oxidation layer, the base layer comprising a first base layer and a second base layer stacked on the anodic oxidation layer, each of the first base layer and the second base layer comprising a deposition layer of a first metal, and an average grain size of the first base layer being less than an average grain size of the second base layer, the anodic oxidation layer comprising a nanopore structure, and grains of the first base layer being at least partially embedded in the nanopore structure of the anodic oxidation layer, wherein a size of pores of the nanopore structure of the anodic oxidation layer is from 10 nm to 100 nm, and a density of pores in the nanopore structure of the anodic oxidation layer is from 100 per μm$^2$ to 3000 per μm$^2$.

2. The apparatus according to claim 1, wherein the substrate comprises aluminum or aluminum alloy, or the first metal comprises one or more of Cr and Ti.

3. The apparatus according to claim 1, wherein a thickness of the first base layer is from 30 nm to 100 nm, and a thickness of the second base layer is from 50 nm to 120 nm.

4. The apparatus according to claim 1, wherein the average grain size in the first base layer is from 3 nm to 30 nm, and a nanohardness of the first base layer is from 10 GPa to 16 GPa; or the average grain size in the second base layer is from 50 nm to 100 nm, and a nanohardness of the second base layer is from 6 GPa to 9 GPa.

5. The apparatus according to claim 1, wherein the base layer further comprises a third base layer, the first base layer, the second base layer, and the third base layer are stacked on the anodic oxidation layer, the third base layer comprises a deposition layer of the first metal, and an average grain size of the third base layer is less than the average grain size of the second base layer.

6. The apparatus according to claim 5, wherein the average grain size in the third base layer is from 30 nm to 60 nm, and a nanohardness of the third base layer is from 8 GPa to 10 GPa; or wherein a thickness of the third base layer is from 30 nm to 100 nm.

7. The apparatus according to claim 1, wherein a thickness of the anodic oxidation layer is from 4 μm to 16 μm.

8. The apparatus according to claim 1, further comprising a function layer, wherein the function layer is disposed on a surface of the base layer away from the anodic oxidation layer, the function layer comprises a color layer, the color layer comprises one or more of an oxide of a second metal, a nitride of the second metal, and a carbide of the second metal, and the second metal is selected from one or more of Cr, Ti, and W; wherein a thickness of the color layer is from 0.3 μm to 3 μm.

9. The apparatus according to claim 8, wherein the function layer further comprises a transition layer, the transition layer is located between the color layer and the base layer, and the transition layer comprises the first metal and the second metal;

wherein a thickness of the transition layer is from 0.3 μm to 1 μm.

10. A method for preparing the apparatus according to claim 1, comprising:

providing the substrate, and forming the anodic oxidation layer by performing anodic oxidation processing on a surface of the substrate;

using the first metal as a first target, applying a first negative bias voltage to the substrate, and forming the first base layer on the surface of the anodic oxidation layer through sputtering in a first vacuum coating; and using the first metal as a second target, forming the second base layer on a surface of the first base layer through sputtering in a second vacuum coating without applying a bias voltage to the substrate.

11. The method according to claim 10, wherein before performing the anodic oxidation processing, the method further comprises: dispensing glue on an electrical contact site on the surface of the substrate; and after performing the anodic oxidation processing, removing the glue on the electrical contact site on the surface of the substrate, to expose the electrical contact site.

12. The method according to claim 10, further comprising: providing a tank solution of an anodic oxidation tank for the anodic oxidation processing, wherein the tank solution is selected from at least one of a sulfuric acid solution, a phosphoric acid solution, and an oxalic acid solution, a molar concentration of acid in the tank solution is from 0.3 mol/L to 0.8 mol/L, and a temperature of the tank solution is from 15° C. to 25° C.

13. The method according to claim 10, wherein the first vacuum coating comprises: applying the first negative bias voltage to the substrate, the first negative bias voltage is from 200 V to 400 V, and applying a first target current of from 20 A to 30 A to the first target;

wherein the second vacuum coating comprises: applying a second target current of from 5 A to 10 A to the second target without applying the bias voltage to the substrate.

14. The method according to claim 10, further comprising: after forming the first base layer and before forming the second base layer, performing ion bombardment on the first base layer for 5 min to 10 min.

15. The method according to claim 10, further comprising:

using the first metal as a third target, applying a third negative bias voltage to the substrate, and forming a third base layer on a surface of the second base layer through sputtering in a third vacuum coating;

wherein the third vacuum coating comprises: applying the third negative bias voltage to the substrate, the third negative bias voltage being from 30 V to 120 V, and applying a third target current of from 15 A to 25 A to the third target.

16. The method according to claim 15, further comprising:

using the first metal and a second metal as a fourth target, forming a transition layer on a surface of the third base layer through sputtering in a fourth vacuum coating, the first metal comprising one or more of Cr and Ti, and the second metal comprising one or more of Cr, Ti, and W.

17. The method according to claim 16, further comprising:

using the second metal as a fifth target, introducing reactive gas comprising one or more of an oxygen source, a nitrogen source, or a carbon source, and forming a color layer on a surface of the transition layer through sputtering in a fifth vacuum coating.

18. A housing, comprising an apparatus, wherein the apparatus comprises a substrate, an anodic oxidation layer, and a base layer, the anodic oxidation layer being disposed on a surface of the substrate, the base layer being disposed on a surface of the anodic oxidation layer, the base layer comprising a first base layer and a second base layer stacked on the anodic oxidation layer, each of the first base layer and the second base layer comprising a deposition layer of a first metal, and an average grain size of the first base layer being less than an average grain size of the second base layer, the anodic oxidation layer comprising a nanopore structure, and grains of the first base layer being at least partially embedded in the nanopore structure of the anodic oxidation layer, wherein a size of pores of the nanopore structure of the anodic oxidation layer is from 10 nm to 100 nm, and a density of pores in the nanopore structure of the anodic oxidation layer is from 100 per μm$^2$ to 3000 per μm$^2$.

19. An electronic product, comprising the housing according to claim 18.

* * * * *